(12) United States Patent
Benedict et al.

(10) Patent No.: US 10,074,772 B2
(45) Date of Patent: Sep. 11, 2018

(54) CONTROLLED LED LIGHT OUTPUT BY SELECTIVE AREA ROUGHENING

(71) Applicant: Lumileds LLC, San Jose, CA (US)

(72) Inventors: Maciej Benedict, Singapore (SG); Paul S. Martin, San Jose, CA (US); Boris Kharas, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 14/363,354

(22) PCT Filed: Jan. 3, 2013

(86) PCT No.: PCT/IB2013/050055
§ 371 (c)(1),
(2) Date: Jun. 6, 2014

(87) PCT Pub. No.: WO2013/105004
PCT Pub. Date: Jul. 18, 2013

(65) Prior Publication Data
US 2014/0327030 A1    Nov. 6, 2014

Related U.S. Application Data

(60) Provisional application No. 61/584,836, filed on Jan. 10, 2012.

(51) Int. Cl.
*H01L 33/22*    (2010.01)
*H01L 33/00*    (2010.01)
*H01L 33/36*    (2010.01)

(52) U.S. Cl.
CPC ............ *H01L 33/22* (2013.01); *H01L 33/005* (2013.01); *H01L 33/0008* (2013.01); *H01L 33/0079* (2013.01); *H01L 33/36* (2013.01)

(58) Field of Classification Search
CPC ........ H01L 22/00–22/34; H01L 33/00–33/648
See application file for complete search history.

(56) References Cited

U.S. PATENT DOCUMENTS 7,102,175 B2 *   9/2006   Orita ................... H01L 33/20
                                                           257/94
7,514,720 B2 *   4/2009   Kim et al. ................... 257/90
(Continued)

FOREIGN PATENT DOCUMENTS

CN    101226977 A    7/2008
CN    101226977 A    7/2008
(Continued)

OTHER PUBLICATIONS

CN office action, Application 201380005153.9, dated May 23, 2016, '16 pps.
(Continued)

*Primary Examiner* — Eric Ward
(74) *Attorney, Agent, or Firm* — Volpe and Koenig, P.C.

(57) ABSTRACT

The surface of a light emitting device is roughened to enhance the light extraction efficiency of the surface, but the amount of roughened area is selected to achieve a desired level of light extraction efficiency. Photo-lithographic techniques may be used to create a mask that limits the roughening to select areas of the light emitting surface. Because the amount of roughened area can be precisely controlled, the light extraction efficiency can be precisely controlled, substantially independent of the particular process used to roughen the surface. Additionally, the selective roughening of the surface may be used to achieve a desired light emission output pattern.

16 Claims, 2 Drawing Sheets

(56) References Cited

U.S. PATENT DOCUMENTS

| | | | |
|---|---|---|---|
| 7,667,224 B2 | 2/2010 | Ohashi et al. | |
| 7,704,770 B2 | 4/2010 | Sung et al. | |
| 7,749,782 B1 | 7/2010 | Knollenberg | |
| 7,875,533 B2 | 1/2011 | Epler | |
| 8,154,042 B2 | 4/2012 | Aldaz | |
| 2003/0119218 A1* | 6/2003 | Jang | 438/46 |
| 2005/0023549 A1 | 2/2005 | Gardner et al. | |
| 2006/0038190 A1 | 2/2006 | Park et al. | |
| 2006/0145170 A1 | 7/2006 | Cho | |
| 2006/0204865 A1* | 9/2006 | Erchak et al. | 430/7 |
| 2007/0121690 A1 | 5/2007 | Fujii et al. | |
| 2007/0194324 A1 | 8/2007 | Kim | |
| 2008/0102549 A1 | 5/2008 | Sung | |
| 2008/0113463 A1 | 5/2008 | Liu | |
| 2009/0146170 A1 | 6/2009 | Zhong | |
| 2009/0267092 A1* | 10/2009 | Fukshima | H01L 33/20 257/98 |
| 2009/0321759 A1* | 12/2009 | Xu | 257/98 |
| 2010/0025717 A1 | 2/2010 | Fuji | |
| 2010/0044732 A1* | 2/2010 | Li | |
| 2010/0151602 A1 | 6/2010 | Knollenberg | |
| 2010/0155754 A1 | 6/2010 | Kasahara et al. | |
| 2010/0264443 A1* | 10/2010 | Wakai et al. | 257/98 |
| 2011/0012154 A1 | 1/2011 | Okagawa | |
| 2011/0062488 A1* | 3/2011 | Uemura | H01L 33/38 257/103 |
| 2011/0114966 A1* | 5/2011 | Liu et al. | 257/76 |
| 2011/0266518 A1* | 11/2011 | Kim | H01L 33/20 257/13 |
| 2011/0300337 A1* | 12/2011 | Tu | 428/156 |
| 2012/0235168 A1* | 9/2012 | Katsuno et al. | 257/88 |

FOREIGN PATENT DOCUMENTS

| | | |
|---|---|---|
| CN | 101331617 A | 12/2008 |
| EP | 1965444 A1 | 9/2008 |
| JP | 2007521641 A | 8/2007 |
| JP | 2011-066453 A | 3/2011 |
| JP | 2011100829 A2 | 5/2011 |
| TW | 200733419 | 9/2007 |
| TW | 200739948 | 10/2007 |
| TW | 200945631 | 11/2009 |
| TW | 201010121 | 3/2010 |
| TW | 201117422 | 5/2011 |
| TW | 201123538 A | 7/2011 |

OTHER PUBLICATIONS

TW Office Action, Application 102100977, dated Aug. 1, 2016, 22 pps.

JP Office Action, Application 2014-550792, dated Oct. 25, 2016, 12 pps.

* cited by examiner

CONTROLLED LED LIGHT OUTPUT BY SELECTIVE AREA ROUGHENING

CROSS-REFERENCE TO PRIOR APPLICATIONS

This application is the U.S. National Phase application under 35 U.S.C. § 371 of International Application No. PCT/IB2013/050055, filed on Jan. 3, 2013, which claims the benefit of U.S. Patent Application No. 61/584,836, filed on Jan. 10, 2012. These applications are hereby incorporated by reference herein.

FIELD OF THE INVENTION

This invention relates to the field of light emitting devices (LEDs), and in particular to a light emitting device having a selectively roughened light emitting surface that enhances the light extraction efficiency of the device.

BACKGROUND OF THE INVENTION

The use of roughened emitting surfaces to enhance LED extraction efficiency is a common aspect of numerous LED designs. Roughening may be applied to different types of LED structures including InGaN, AlInGaP systems, and in flip chip bonded, and vertical thin film device architectures, and others.

U.S. Pat. No. 7,875,533, "PACKAGE INTEGRATED THIN FILM LED, AND DEVICES", issued to John Epler, Paul Martin and Michael Krames on 25 Jan. 2011, and incorporated by reference herein, discloses roughening of the GaN light emitting surface of an LED to enhance the light extraction efficiency using a photo-electrochemical etch process using a KOH solution. The depth of the etching is controlled using an etch stop layer that is grown during the formation of the light emitting device. In like manner, USPA 2010/0025717, USPA 2009/0146170, USPA 2008/0113463, and U.S. Pat. No. 7,749,782 also disclose techniques for improving light extraction efficiency by roughening the light emitting surface, and are incorporated by reference herein.

Each of the above referenced methods creates a substantially uniformly roughened surface that allows for maximum light extraction, often allowing for the extraction of twice as much light as the original unroughened surface. With continuing increases in light emission efficiency, a doubling of the light extraction efficiency may be undesirable in certain applications. For example, it may be desirable to limit the total light output to a customer's maximum-flux specification, to conform to a particular standard, or to achieve a particular lighting effect.

For each roughening method it may be possible to change the light extraction efficiency by changing the characteristics of the roughening, such as by changing the parameters of the roughening process to increase or reduce the coarseness or other aspect of the resultant roughened surface. However, the cost of developing customized processes may be excessive, and the achievable range of controllable efficiency may be limited or subject to variances in the process.

SUMMARY OF THE INVENTION

It would be advantageous to be able to reliably and/or inexpensively control the light extraction efficiency of a light emitting device. It would also be advantageous to be able to control the light extraction efficiency of a light emitting device without substantially affecting and/or being affected by the processes used to roughen the surface of the light emitting device.

To better address one or more of these concerns, in an embodiment of this invention, conventional techniques are used to roughen the surface of a light emitting device to enhance the light extraction efficiency, but the amount of roughened area is selected to achieve a desired level of light extraction efficiency. Photo-lithographic techniques may be used to create a mask that limits the roughening to select areas of the light emitting surface. Because the amount of roughened area can be precisely controlled, the light extraction efficiency can be precisely controlled, substantially independent of the particular process used to roughen the surface. Additionally, the selective roughening of the surface may be used to achieve a desired light emission output pattern.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Figure 1A:
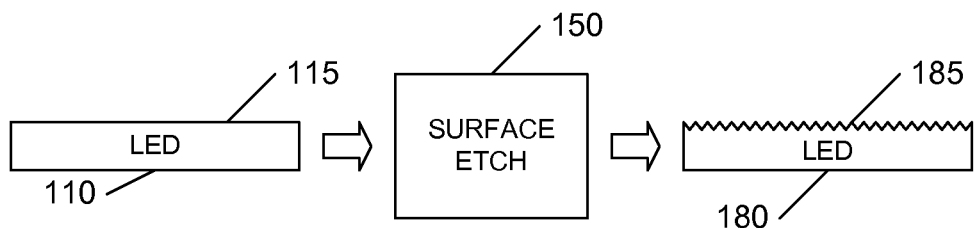
FIGS. 1A-1C illustrate an example prior art process for enhancing the light extraction efficiency of a light emitting device by roughening the light emitting surface of the light emitting device.
Figure 1B:
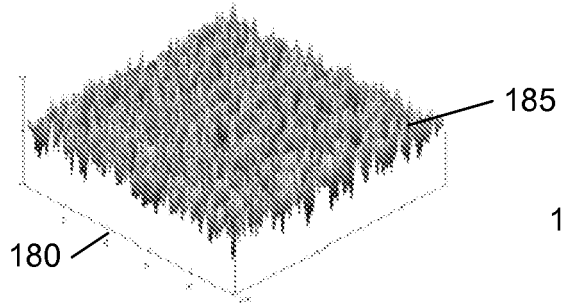
Figure 1C:
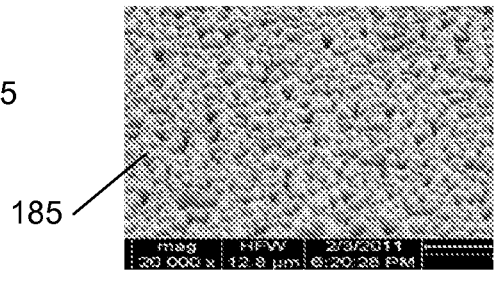

FIGS. 1A-1C illustrate an example prior art process for enhancing the light extraction efficiency of a light emitting device 110 by roughening the light emitting surface 115 of the light emitting device. For the purposes of this discloser, the light emitting surface 115 of the device is considered to be the portions of the surface of the device that are able to emit the light generated within the device. Portions of the surface of the device that are unable to emit the light, such as portions covered by contacts or other structures are not light emitting surfaces. For ease of illustration and explanation, the light emitting surface 115 is illustrated as being the entire upper surface of the device 110, although there are likely to be regions of the upper surface through which no light is emitted, and are thus not part of the light emitting surface, per se.

FIG. 1A illustrates an example flow diagram for the process. The light emitting device 110 may be created by any of a variety of processes known in the art, and includes an upper surface that may include GaN, AlInGaP, or other material. Due to a difference in the index of refraction between the surface material and the material exterior to the device 110, which may be air, or a subsequently applied epoxy or other material, the substantially flat upper surface, a substantial amount of the light generated within the device 110 is internally reflected from the surface 115, and subsequently absorbed within the device 110.

To increase the amount of light that is extracted from the device 110, the light emitting surface 115 is roughened to improve the light extraction efficiency. Any number of processes 150 may be used to produce a device 180 with a roughened surface 185, including, for example, plasma etching, wet chemical, photo electrochemical (PEC), laser, and other methods. An example etching process may include, for example, an inductively coupled plasma etching system with high bias power 100-1000 W and introduction of etching gasses such as Ar, O2, HBr, Cl2, BCl3, SiC4, SF6. For ease of reference, the term 'etching' is used hereinafter to refer to any method that introduces a roughened surface 185 to the light emitting device 110, producing a light emitting device 180 having a roughened surface.

FIGS. 1B and 1C illustrate images of an example roughened surface 185 of a plasma etched light emitting device 180. The irregular interface between the light emitting surface 185 and the material exterior to the device 180 reduces the likelihood that light beams become 'trapped' within the device 180 due to internal reflection, thereby increasing the amount of light that is extracted from the roughened surface 185. A doubling in light extraction by roughening the flat light emitting surface 115 of a device 110 is not uncommon.

As noted above, the light emitting surface 115 is illustrated as extending across the upper surface of the device 110 for ease of illustration, although the upper surface may include regions that are not part of the light emitting surface 115, such as contact areas. In like manner, the roughened surface 185 is illustrated as extending across the upper surface of the device 180, although for the purposes of this disclosure, the roughened surface 185 corresponds to a roughening of the light emitting surface 115. That is, the aforementioned portions of the upper surface of the device 110 that are not included in the light emitting surface 115 are not included in the roughened surface 185, regardless of whether these portions are roughened by the etching process 150.

As mentioned above, in some applications, it is desirable to produce a particular amount of light, rather than as much light as the device 180 is capable of producing. Assuming that the techniques used to produce the device 180 are capable of producing devices 180 that are able to produce more than the amount of light desired, the parameters of one or more of the manufacturing processes may be adjusted to produce less than the maximum achievable light output. For example, the amount of light reaching the surface 115 of the device 180 may be reduced by allowing more of the generated light to be absorbed within the device 180, or by allowing more of the light reaching the surface 185 to be internally reflected, or by a combination of both.

For example, to reduce the light extraction efficiency, the duration of exposure to the etching chemicals, or the concentration or intensity of the etching chemicals, may be adjusted to reduce the degree of roughening, thereby increasing the likelihood of light being absorbed within the device before it is able to escape through the light emitting surface of the device. If the process of the aforementioned U.S. Pat. No. 7,875,533 is used, for example, the growth of the etch-stop layer may be controlled to reduce the degree of surface roughening.

That is, to control the maximum light output provided by the device, the parameters of the etching process may be adjusted to be 'sub-optimal' to reduce the efficiency of the light extraction from the device. However, the degree of precision and/or the range of control that is/are achievable by a sub-optimized etching process may not be sufficient to provide the desired level of light output, and modifying process parameters for different levels of light output for different applications may introduce additional tasks and costs associated with such process control.

In an example embodiment of this invention, the proportion of the surface area that is roughened is controlled to achieve a desired level of light extraction efficiency. In this manner, the process parameters may be maintained at their optimal levels, and a wide range of precise control can be achieved. That is, the control will range from the minimal extraction efficiency provided by a completely un-roughened surface to the maximum extraction efficiency provided by a completely roughened surface, with the precision of the process being controlled by the precision with which areas of the surface are selected to be roughened or un-roughened.

Figure 2:
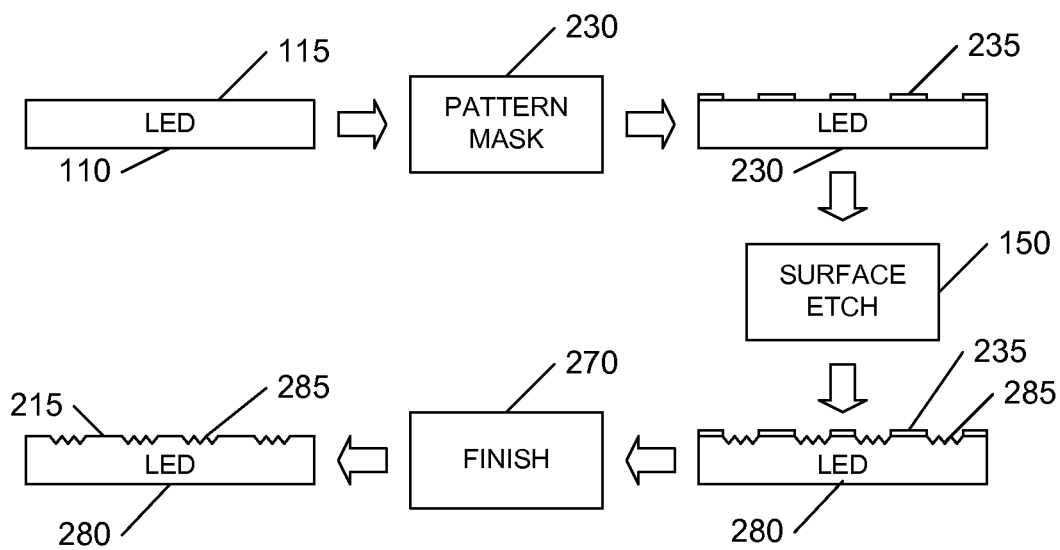
FIG. 2 illustrates an example flow diagram of a process for enhancing the light extraction efficiency of a light emitting device by roughening select areas of the light emitting surface of the light emitting device.

FIG. 2 illustrates an example process for controlling the light output of a light emitting device based on the amount of area that is roughened on the surface of the device.

A masking process 230 is used to apply an etching-preventing or etching-inhibiting pattern 235 on the light emitting device 110. As is well known in the art, techniques are available to precisely create a pattern of material 235 upon a surface 115, including, for example, photo-lithography, screen-printing, and so on. The material selected for creating the pattern 235 will be dependent upon the particular etching process 150 that is subsequently applied. In an example plasma etch process, conventional photo-resist material may be used.

One of skill in the art will recognize that, in some processes, the etching-inhibiting pattern 235 may also be created by creating a 'negative' pattern of etching-producing or etching-enhancing material in the areas where the etching is to be produced. In like manner, one of skill in the art will recognize that other processes, such as laser etching may be used to selectively roughen the surface.

The surface area that is not masked by the etching-inhibiting material 235 is roughened by applying a surface etch process 150. As noted above, because the extraction efficiency is controlled based on the amount of area that is roughened, this process does not require modifications to the conventional etch process 150, per se. This etch process 150 produces a light emitting device 280 having roughened surfaces 285 only in the areas defined by the pattern 235.

Optionally, a finishing process 270 may be applied to remove any residual material from the selectively roughened light emitting device 280. In the example plasma-etch process with photo-resist material 235, the photo-resist material may be removed to produce a light emitting device having areas of the original un-roughened surface 115 and areas of roughened surface 285. This removal process may include using a conventional wet-resist stripping process or O2 ash process.

Figure 5:
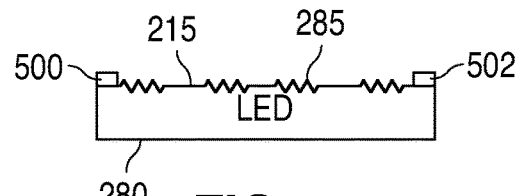
FIG. 5 illustrates a light emitting device with a roughened light emitting surface and an n-contact and a p-contact.

FIG. 5 illustrates the light emitting device 280 of FIG. 2 with an n-contact 500 and a p-contact 502. The roughened surface 285 is not covered by any portion of either contact.

Given a light emitting device 280 with un-roughened areas 215 and roughened areas 285, the light extraction efficiency will be determined by the relative proportions of these areas 215, 285.

Figure 3:
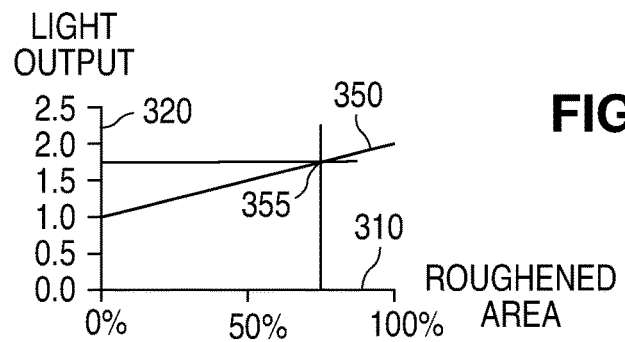
FIG. 3 illustrates an example relationship between the light extraction efficiency and the percentage of roughened area on the light emitting surface.

In the example plasma-etching of selected areas of the surface, the extraction efficiency has been found to be substantially linear with respect to the proportion of roughened surface area, as illustrated by the line 350 in FIG. 3. In this example, the light output is normalized to the amount of light that the original light emitting device 110 with an un-roughened surface 115. As illustrated in this figure, a fully roughened surface 285 provides about twice the light output as an un-roughened surface 115. As illustrated at 355 of FIG. 3, when three-quarters (75%) of the surface area is roughened, the light output is about 1.75 times the light output of the un-roughened surface 115.

Other processes may produce a different relationship between the amount of light output 320 and the proportion of roughened area 310, and such a relationship can be easily determined by sampling the light output of devices having different proportions of roughened areas. Once the relationship between light output 320 and roughened area 310 is determined, a precise control of the output of the device 280 can be easily achieved by precisely controlling the proportion of the areas 115 and 285 on the surface of the device 280.

FIGS. 4A-4D illustrate example patterns of selective roughened light emitting surfaces. One of skill in the art will recognize that any of a variety of roughened patterns may be used to achieve different optical effects while also controlling the amount of light being emitted from the surface.

Figure 4A:
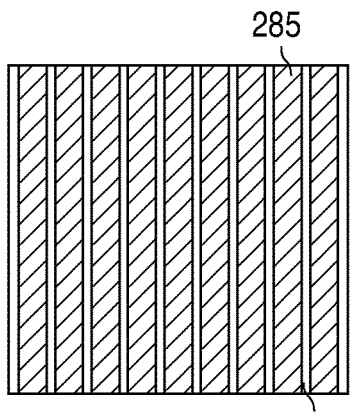
FIGS. 4A-4D illustrate example patterns of selective roughened light emitting surfaces.

FIG. 4A illustrates an example surface area of a device having roughened areas 285 and un-roughened areas 115 arranged in vertical bands. In this example, the proportion of roughened area is about 75%, which, in the example of a linear relationship 350 between light output 320 and roughened area 310 of FIG. 3, will provide for a light output that is about 1.75 times the amount of light provided by the light emitting device before roughening.

In this example, bands of brighter light from the roughened areas 285 will be produced, and may be objectionable. One of skill in the art will recognize that alternative patterns may be defined having the desired proportion of roughened area with less noticeable patterns. For example, instead of the nine bright roughened bands 285 of FIG. 4A, with clearly distinguishable dimmer un-roughened bands 115, hundreds of roughened bands 285 could be provided, with correspondingly smaller dimmer bands 115 that are indistinguishable by the human eye.

Figure 4B:
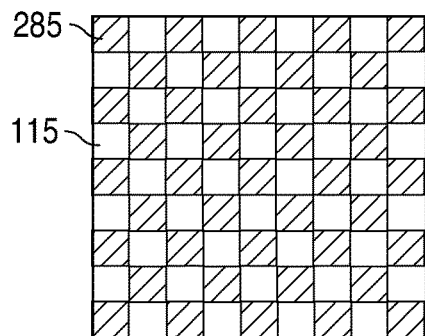

FIG. 4B illustrates a checker-board like arrangement of roughened areas 285 and un-roughened areas 115. The example pattern provides for a proportion of roughened area of about 50%, which, in the example of FIG. 3, will provide a light output of about 1.5 times the amount of light provided by the light emitting device before roughening. By arranging the areas 285, 115 in a checkerboard arrangement, the contrast between the brighter light over the areas 285 and dimmer light over the areas 115 will be less noticeable than a pattern of bands having the same proportion of roughened areas 285. As in the example of FIG. 4A, the number of distinct areas 285, 115 may be increased to reduce any noticeable optical anomalies.

In the examples of FIGS. 4A and 4B, techniques for obscuring the light output pattern produced by the arrangement of roughened and un-roughened areas 285, 115 are presented. In some applications, a distinguishable light output pattern may be desirable.

Figure 4C:
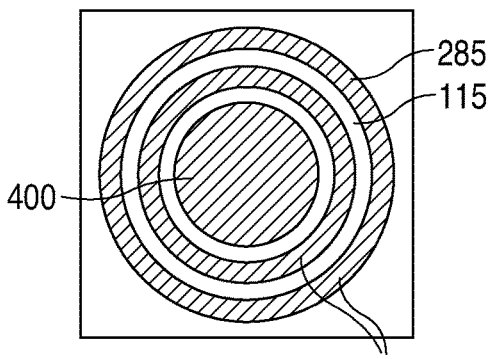

In FIG. 4C, the roughened areas 285 are arranged to provide a light output pattern that will be brighter in the center region, and progressively dimmer as the distance from the center increases, providing a spotlight-like pattern. The rings 285, 115 will be sized to provide the desired amount of light output based on the proportion of these roughened 285 and un-roughened 115 areas.

Figure 4D:
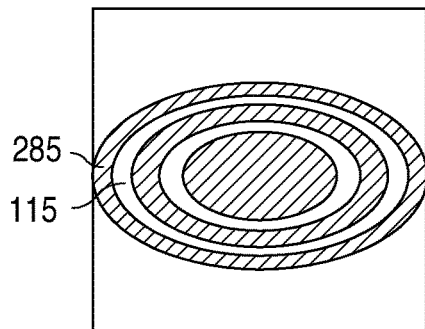

In FIG. 4D, the roughened areas 285 are arranged to provide a bright-center pattern with an elliptical light output pattern.

These patterns 4A-4D are provided merely to illustrate that virtually any pattern may be used to create a desired optical effect while at the same time controlling the amount of light that will be emitted from the light emitting surface. Other patterns will be evident to one of skill in the art. For example, in the patterns of FIGS. 4C-4D, the un-roughened pattern 285 at the center of the surface may be as illustrated, while the area beyond this center may be a less noticeable pattern, such as the checker-board arrangement of FIG. 4B. In like manner, the mask may also define a graphic or decorative image.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein a greater range of control is provided by further limiting the amount of light that is emitted from the un-roughened surface 115. That is, in FIG. 3, the relation 350 between the light output 320 and the roughened area 310 is assumed to range from totally flat surface 115 to a totally roughened surface 185. However, if regions of the un-roughened surface are opaque, the light output may be reduced below the amount of light that is produced by a (non-opaque) totally flat surface 115. Such opacity may be achieved by leaving some or all of the mask material 235 on the surface of the selectively etched device 280 of FIG. 2.

In like manner, although the invention is presented in the context of a binary 'roughened'/'not roughened' masking process, a combination of techniques may be used to create particular optical effects. A forced Gaussian profile may be produced, for example, by creating a bulls-eye pattern, as illustrated in FIG. 4C, wherein a center section 400 is roughened completely and other sections 402 are roughened at lower percentages. The variation in roughening may be produced by selectively applying multiple stages of the roughening process, by using different roughen-inhibiting materials, by growing etch-stop layers at different depths, and so on.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method comprising:
   determining a target light extraction efficiency of a light emitting device;
   determining, based on an output function, a proportion of a roughened surface area to a not roughened surface area wherein the light emitting device emits the target light extraction efficiency when configured based on the determined proportion;
   applying a surface etch process on a light emitting surface to create the roughened surface area, wherein the roughened surface area relative to the not roughened surface area is based on the determined proportion, and wherein the light emitting surface is a top surface of the light emitting device that is not covered by a contact;
   applying an etch-inhibiting pattern on the light emitting surface to create the not roughened surface area, wherein the amount of the not roughened surface area relative to the amount of roughened surface area is based on the determined proportion, and wherein the area that is not roughened surrounds the roughened surface area.

2. The method of claim 1, wherein the applying the etch-inhibiting pattern includes applying a mask material.

3. The method of claim 2, wherein applying the mask material includes a photo-lithographic process.

4. The method of claim 1, wherein the light emitting device emits light from the roughened surface area at a first light output level and from the area that is not roughened at a second light output level that is less than the first light output level.

5. The method of claim 4, wherein the first light output level is approximately twice the second light output level.

6. The method of claim 1, wherein the roughened surface area is patterned to provide a distinguishable optical effect.

7. The method of claim 1, wherein the output function is linear such that when the proportion of roughened surface area to a not roughened surface area is increased by X, the light extraction efficiency is also increased by X.

8. The method of claim 1, wherein the output function is non-linear such that when the proportion of roughened surface area to a not roughened surface area is increased by X, the light extraction efficiency is increased by Y.

9. The method of claim 1, wherein the output function comprises variables selected from the group consisting of a roughened surface area, a not roughened surface area, and a target light extraction efficiency.

10. The method of claim 1, wherein the roughened surface area comprises a plurality of select areas, and at least one of the select areas is roughened to a degree of roughness that differs from a degree of roughness of another of the select areas.

11. The method of claim 1, wherein the roughened surface area is uncovered.

12. The method of claim 1, wherein the roughened and not roughened surface areas form a pattern selected from one of a checkerboard and a bulls-eye.

13. The method of claim 1, wherein the roughened surface area and the not roughened surface area are part of a pattern of roughened and not roughened surface areas selected from one of concentric circles and concentric ellipses.

14. The method of claim 1, further comprising creating an additional roughened surface area, wherein the additional roughened surface area surrounds the not roughened surface area.

15. The method of claim 1, wherein the roughened surface area is a random, non-periodic roughened surface.

16. A method comprising:
    determining a target light extraction efficiency of a light emitting device;
    determining that a proportion, X/Y, of a roughened surface area to a not roughened surface area results in the target light extraction efficiency for the light emitting device;
    applying a surface etch process on the light emitting surface to create the roughened surface area, wherein the roughened surface area relative to the not roughened surface area is X, and wherein a light emitting surface is a top surface of the light emitting device that is not covered by a contact;
    applying an etch-inhibiting pattern on the light emitting surface to create the not roughened surface area, wherein the not roughened surface area relative to the roughened surface area is Y.

* * * * *